United States Patent
Berrendonner et al.

(10) Patent No.: US 10,506,048 B2
(45) Date of Patent: Dec. 10, 2019

(54) AUTOMATIC REPORT RATE OPTIMIZATION FOR SENSOR APPLICATIONS

(71) Applicant: Microsoft Technology Licensing, LLC, Redmond, WA (US)

(72) Inventors: Jocelyn Berrendonner, Kirkland, WA (US); Katherine Blair Huffman, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 187 days.

(21) Appl. No.: 15/184,086

(22) Filed: Jun. 16, 2016

(65) Prior Publication Data

US 2017/0264689 A1    Sep. 14, 2017

Related U.S. Application Data

(60) Provisional application No. 62/307,244, filed on Mar. 11, 2016.

(51) Int. Cl.

| | | |
|---|---|---|
| *G06F 19/00* | (2018.01) | |
| *G01R 29/02* | (2006.01) | |
| *G04F 1/00* | (2006.01) | |
| *G04F 3/00* | (2006.01) | |
| *G04F 5/00* | (2006.01) | |
| *G04F 8/00* | (2006.01) | |
| *G04F 10/00* | (2006.01) | |
| *G04G 5/00* | (2013.01) | |
| *G04G 7/00* | (2006.01) | |
| *H04L 29/08* | (2006.01) | |
| *G01D 3/10* | (2006.01) | |
| *G01C 5/06* | (2006.01) | |
| *G01C 17/02* | (2006.01) | |
| *G01C 19/00* | (2013.01) | |
| *G01C 21/16* | (2006.01) | |
| *H03M 1/12* | (2006.01) | |
| *G01P 15/00* | (2006.01) | |

(52) U.S. Cl.
CPC .............. *H04L 67/12* (2013.01); *G01C 5/06* (2013.01); *G01C 17/02* (2013.01); *G01C 19/00* (2013.01); *G01C 21/16* (2013.01); *G01D 3/10* (2013.01); *G01P 15/00* (2013.01); *H03M 1/126* (2013.01)

(58) Field of Classification Search
CPC .................................. H04L 67/12; G01D 3/10
USPC .......................................... 702/79, 122, 176
See application file for complete search history.

(56) References Cited

U.S. PATENT DOCUMENTS 6,321,092 B1    11/2001   Fitch et al.
7,203,752 B2     4/2007   Rice et al.
(Continued)

OTHER PUBLICATIONS

Kansal, et al., "The Latency, Accuracy, and Battery (LAB) Abstraction—Programmer Productivity and Energy Efficiency for Continuous Mobile Context Sensing", In Proceedings of the ACM SIGPLAN international conference on Object oriented programming systems languages & applications, Oct. 29, 2013, 16 pages.
(Continued)

*Primary Examiner* — Michael P Nghiem
(74) *Attorney, Agent, or Firm* — Newport IP, LLC; Han Gim

(57) ABSTRACT

A report interval mode is selected from one of multiple selectable report interval modes in cases where the preferred sensor sample intervals of multiple applications are different. By using multiple selectable report interval modes some of the problems that occur when a single fixed report interval mode is used can be avoided.

17 Claims, 7 Drawing Sheets

(56) References Cited

U.S. PATENT DOCUMENTS

| | | | |
|---|---|---|---|
| 8,473,729 B2 | 6/2013 | Trethewey et al. | |
| 9,179,316 B2 | 11/2015 | Raleigh | |
| 2003/0179104 A1* | 9/2003 | Hermary | G05B 19/408 340/870.16 |
| 2007/0016687 A1* | 1/2007 | Agarwal | G06F 9/5083 709/238 |
| 2011/0109438 A1* | 5/2011 | Dijkstra | H04Q 9/00 340/8.1 |
| 2011/0244810 A1* | 10/2011 | Czompo | H03M 1/1265 455/73 |
| 2014/0020445 A1 | 1/2014 | Waters et al. | |
| 2014/0288873 A1* | 9/2014 | Czompo | G01C 19/5776 702/141 |
| 2015/0282075 A1* | 10/2015 | Suga | H04W 52/0209 370/311 |

OTHER PUBLICATIONS

Tsitsikas, Kimon, "Batch Scheduling for Energy-Efficient Sensing in Smartphones", In Master's Thesis in Embedded Systems of Delft University of Technology, Jul. 31, 2013, 53 pages.

Zhuang, et al., "Improving Energy Efficiency of Location Sensing on Smartphones", In Proceedings of the 8th international conference on Mobile systems, applications, and services, Jun. 15, 2010, 15 pages.

Man, et al., "Energy-efficient automatic location-triggered applications on smartphones", In Journal of Computer Communications, vol. 50, Sep. 1, 2014, pp. 1-12.

Paek, et al., "Energy-Efficient Rate-Adaptive GPS-based Positioning for Smartphones", In Proceedings of the 8th international conference on Mobile systems, applications, and services, Jun. 15, 2010, 16 pages.

Jurdak, et al., "Adaptive GPS Duty Cycling and Radio Ranging for Energy-efficient Localization", In Proceedings of the 8th ACM Conference on Embedded Networked Sensor Systems, Nov. 3, 2010, 15 pages.

Lane, et al., "Piggyback CrowdSensing (PCS): Energy Efficient Crowdsourcing of Mobile Sensor Data by Exploiting Smartphone App Opportunities", In Proceedings of the 11th ACM Conference on Embedded Networked Sensor Systems, Nov. 11, 2013, 14 pages.

International Patent Application No. PCT/US2017/020559; Int'l Search Report and the Written Opinion; dated May 29, 2017; 13 pages.

* cited by examiner

AUTOMATIC REPORT RATE OPTIMIZATION FOR SENSOR APPLICATIONS

CROSS-REFERENCE TO RELATED APPLICATIONS

This application claims the benefit of U.S. Provisional Patent Application Ser. No. 62/307,244, filed Mar. 11, 2016, the disclosure of which is hereby incorporated by reference in its entirety.

BACKGROUND

A wide variety of sensors are used with computer systems. In particular, modem mobile phones include sensors such as accelerometers, gyroscopes, magnetometer compasses, and barometers.

Accelerometers in mobile phones, for example, may be used to detect the orientation and movement of the phone. The gyroscope adds an additional dimension to the information supplied by the accelerometer by tracking rotation or twist.

Magnetometer compasses can provide mobile phones with information regarding the orientation of the mobile phone in relation to the Earth's magnetic field. Mobile phones can use the magnetometer compasses to rotate digital maps depending on a user's physical orientation.

A barometer is a sensor that measures atmospheric pressure. Barometers can be used to determine the altitude of the mobile phone.

Data from such sensors can be accessed as requested by applications that are executing on the computer system. For example, applications can request that the sensor data be provided at a given interval to enable the application to provide various functions and services.

SUMMARY

When only one application requests data from a sensor, an operating system may provide the sensor data at the rate requested by the application if the requested rate is consistent with the capabilities of the sensor, power utilization constraints, and other factors. However, a conflict may occur when multiple applications request sensor data from the same sensor at different intervals. For example, a first application may request sensor data be provided every 3 seconds and a second application may request sensor data be provided every 5 seconds.

Such conflicts may be avoided by oversampling the sensor. For example, sampling the sensor every second allows for the first application to be provided sensor data every 3 seconds and the second application to be provided sensor data every 5 seconds. The operating system takes every third sample of the one second interval sensor samples and provides it to the first application and every fifth sample of the one second interval samples and provides it to the second application. This may be referred to as "oversampling" because neither application requests sensor data at that short of an interval. In this example, the sensor is sampled 3 times greater than the shortest interval requested by an application.

However, such oversampling may result in excessive resource and power use. Oversampling can be avoided by requesting sensor data at the shortest requested interval (but not at a shorter oversampling interval). However, not oversampling can cause conflicts because of the differing interval requests.

Conflicts arising from different requested sampling intervals may be resolved by using report interval modes. Report interval modes control how the sensor reports data in case of a conflict between sensor interval requests. For example, a strict mode may be used which attempts to provide data at the interval requested by each application. In a strict mode, the operating system may provide sensor data every 3 seconds to a first application and manipulate the received sensor data to provide (not always accurate or fresh) sensor data every 5 seconds to the second application.

Alternately, an opportunistic mode may be used in which data is provided at the highest rate requested by one of the applications. For example, in an opportunistic mode, sensor data may be provided to both applications every 3 seconds even though the second application requested the sensor data every 5 seconds. However, this may cause problems at the second application if the rate conflicts with what the second application needs.

Embodiments of the present application include selecting a report interval mode from one of multiple selectable report interval modes when the requested sample intervals of the applications are different. For example, the computing device can select between the strict mode and the opportunistic mode.

The computing device can receive report interval mode requests from the applications themselves. This can allow an application to indicate how it would like to receive sensor data in the case of a conflict. For example, an application can indicate whether the application prefers to receive the sensor data at the requested interval (with potential distortions in timing or accuracy) in a strict mode or whether the application can handle sensor data at a shorter interval in an opportunistic mode.

The use of multiple selectable report interval modes avoids potential problems that can occur when the report interval mode cannot be changed. For example, a fixed strict mode may provide distorted data to an application that could handle sensor data at a higher rate; a fixed opportunistic mode may overwhelm an application that needs data to be provided at the requested interval.

DETAILED DESCRIPTION OF ILLUSTRATIVE EXAMPLES

Figure 1:
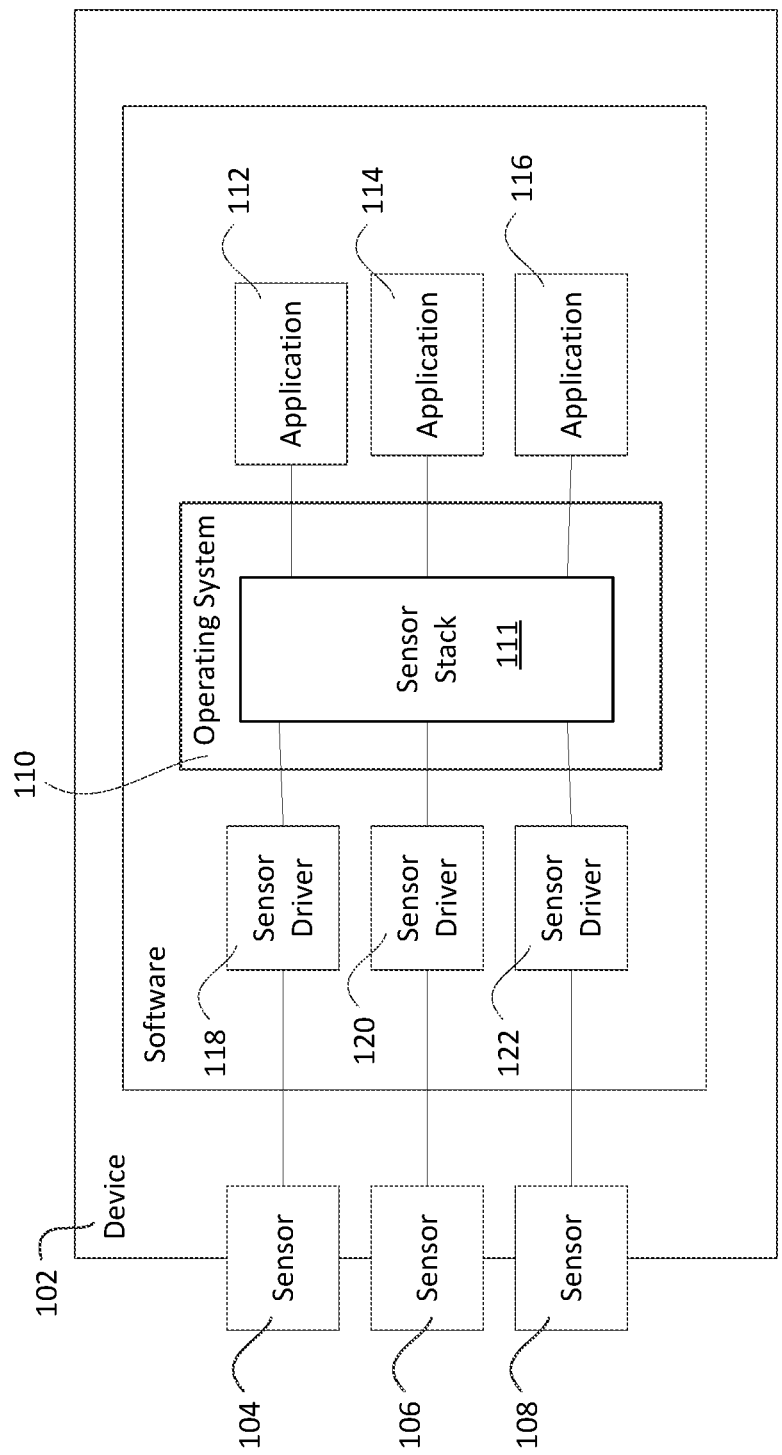
FIG. 1 is a functional diagram of one embodiment.

FIG. 1 shows a functional diagram of a device 102 according to one embodiment. The device 102 may be a computer system such as a smartphone, laptop, desktop, embedded system, Internet of Things (IoT) device or any other device with a processor. The device 102 may interact with sensors, such as sensors 104, 106 and 108. Sensors, such as sensors 104, 106 and 108, may include a device or element that detects events or changes in an environment and provides a corresponding output. Sensors, such as sensors 104, 106 and 108 may be local at the computer system or remote. Exemplary sensors may include accelerometers, gyroscopes, magnetometer compasses, and barometers.

Operating system (OS) 110 may be system software that manages computer hardware and software resources and provides common services for computer programs or applications, such as applications 112, 114, and 116. Operating system 110 may include a sensor stack 111. A sensor stack 111 may implement sensor controller functionality.

The sensors 104, 106, and 108 may be associated with sensor drivers 118, 120, and 122. Drivers may be software elements that operate or control a particular type of device that is part of or otherwise coupled to a computer. Sensor drivers are typically software elements that interact with sensor hardware and operating system 110 such that the operating system 110 may control the sensor and receive data from the sensor. Driver 118, 120, and 122 may interact with sensor stack 111 using an Application Programming Interface (API) that allows for the transfer of sensor data and for sensor stack 111 to control the sensors 104, 106, and 108. For example, the API may allow the application to request a sensor report interval and a report interval mode (in the event of an interval conflict as discussed below).

Figure 6:
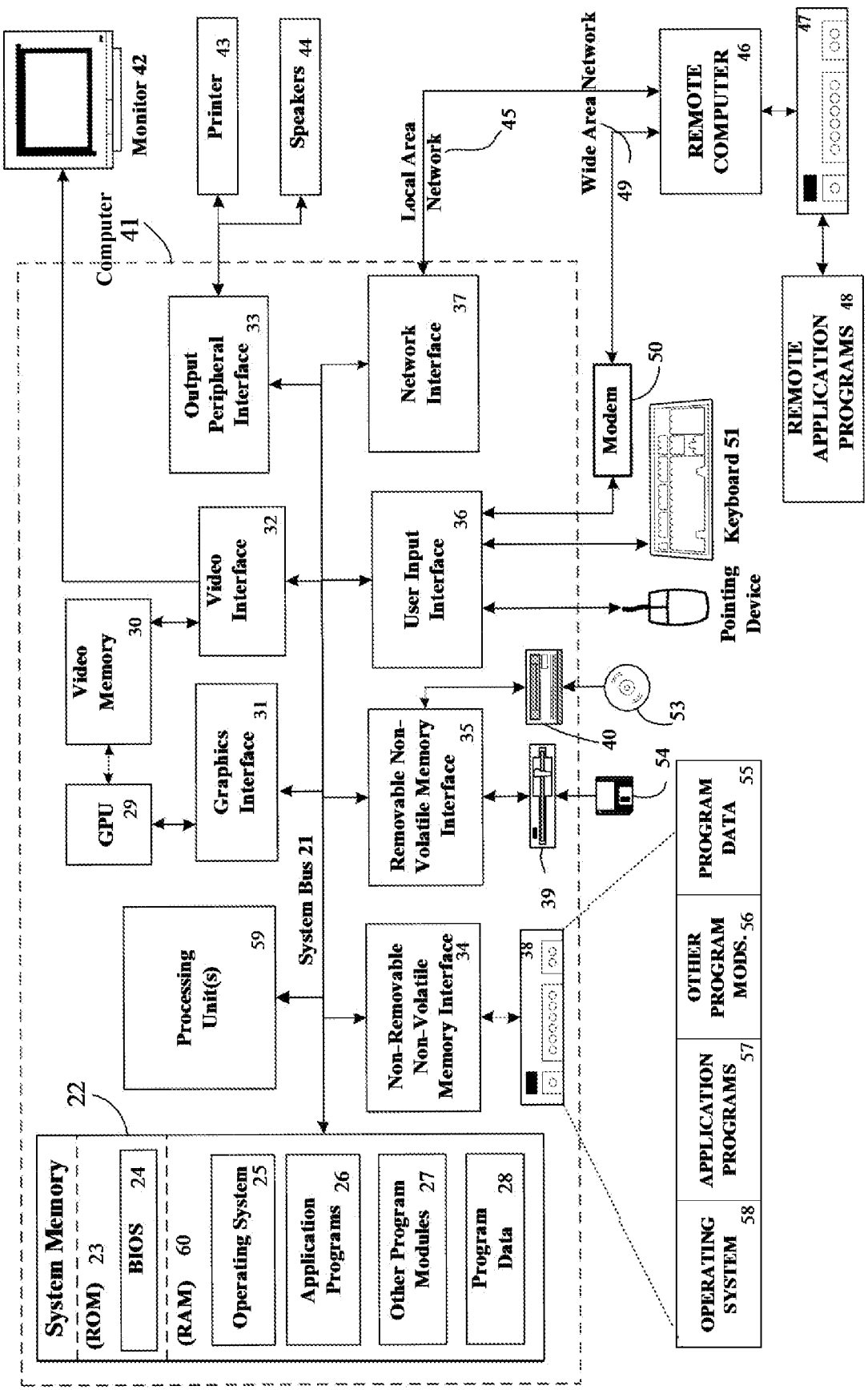
FIG. 6 is a diagram that illustrates an exemplary computer system
Figure 7:
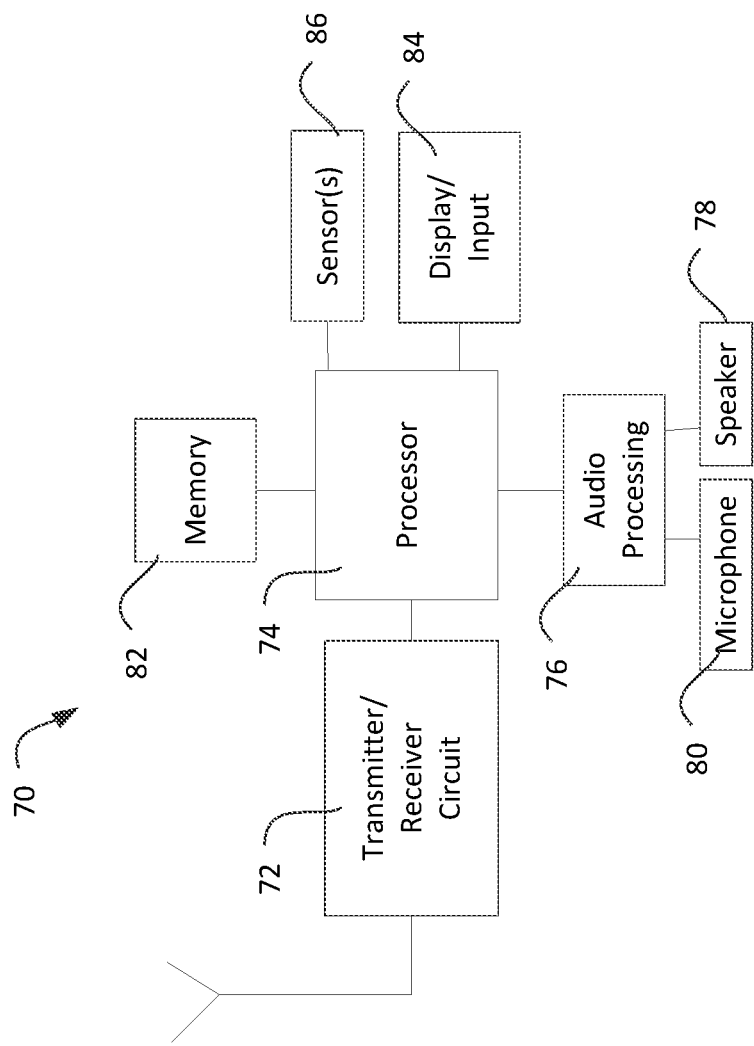
FIG. 7 is a diagram that illustrates an exemplary mobile phone system

Operating system 110, drivers 118, 120, and 120, and applications 112, 114, and 116, may be implemented using at least one processor and memory as shown in FIGS. 6 and 7.

In one embodiment, multiple applications, such as applications 112 and 114, may request sensor data with different intervals from a single sensor, such as sensor 104. As described below, the sensor stack 111 may select a report interval mode to control the sensor data sent to the applications 112 and 114.

Figure 2:
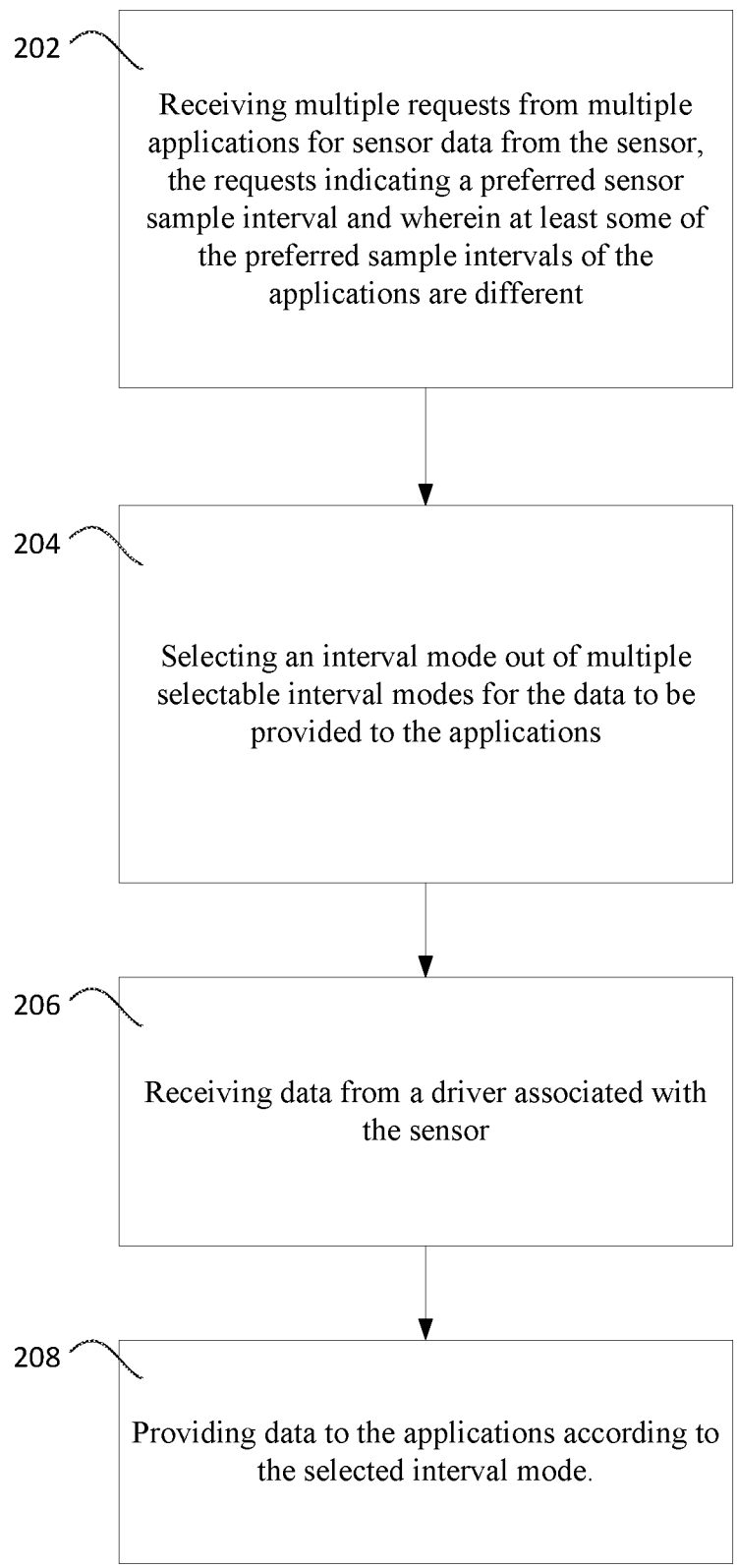
FIG. 2 is a flow chart of one embodiment.

FIG. 2 shows a method of providing sensor data according to one embodiment. A computer system may provide data to multiple applications that request data from a sensor.

In step 202, multiple requests may be received from multiple applications for sensor data from the sensor. The requests may indicate preferred sensor sample intervals for the applications.

When at least some of the preferred sample intervals of the applications are different, in step 204, a report interval mode is selected out of multiple selectable report interval modes for the sensor data to be provided to the applications. In one embodiment, the applications may request report interval modes in addition to the desired sensor sample interval. The suggested report interval modes may be selected unless they are conflicting. In some embodiments, the sensor stack or other function executing on the computing device may select a report interval mode. For example, if the requesting application does not indicate a requested report interval mode, then the sensor stack may select a default report interval mode or select a report interval mode based on one or more selection criteria. Examples of such conflicting suggested report interval modes are provided below. In one embodiment, as discussed below, the selectable report interval modes may include a strict mode, opportunistic mode, and automatic mode.

In step 206, sensor data from a driver associated with the sensor is received. The sensor stack may request that the driver provide the sensor data according to a specified reporting interval. In some embodiments, the sensor stack may provide sensor data in an automatic mode if selected as described below.

In step 208, sensor data is provided to the requesting applications according to the selected report interval mode.

The use of multiple report interval modes may avoid problems that may occur when a fixed report interval mode is used. The use of multiple report interval modes provides a mechanism that allows, for example, improvements in power savings and behavioral consistency.

Figure 3:
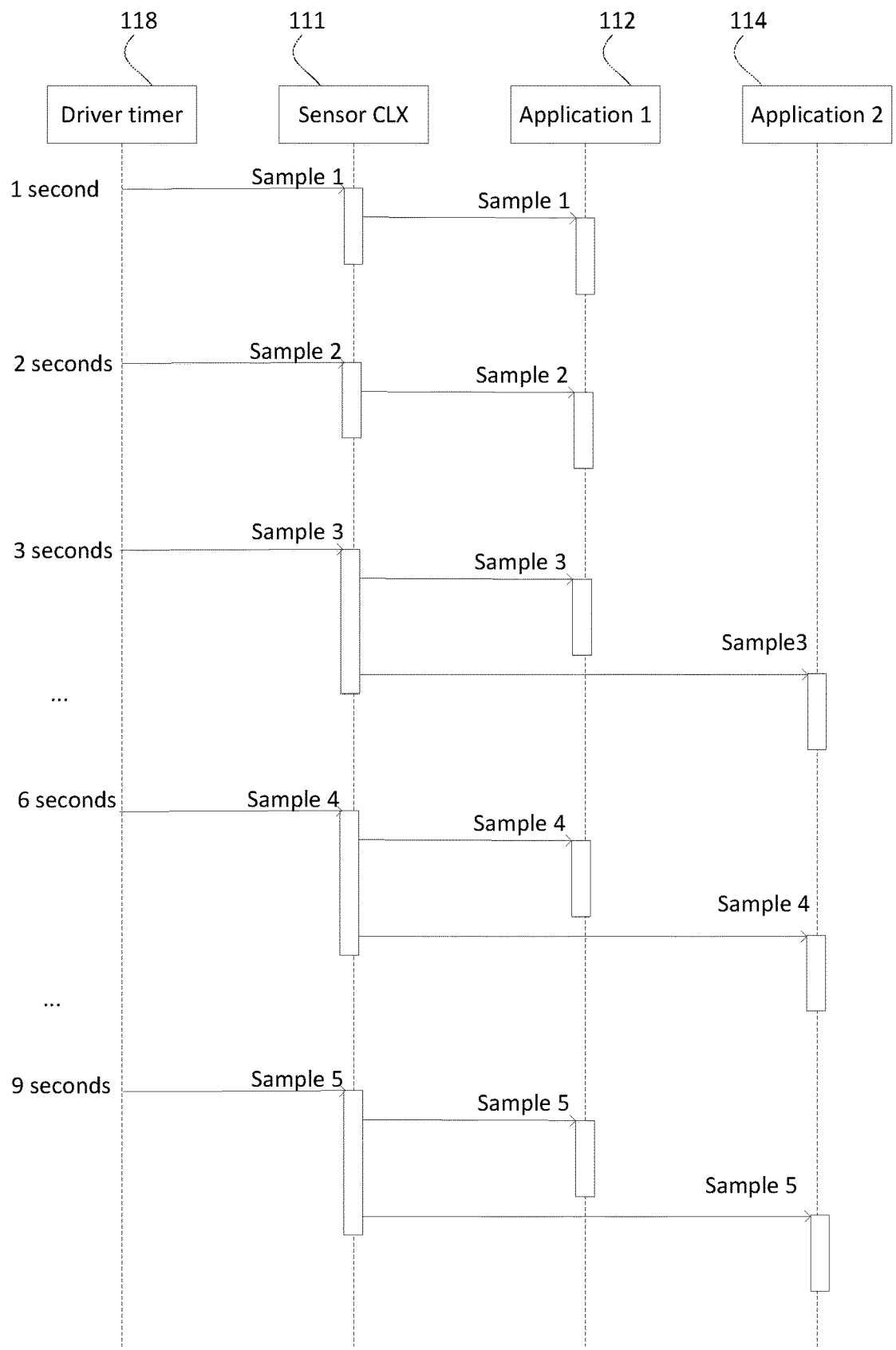
FIG. 3 is a flow chart that illustrates a strict interval mode.

Applications may provide indications of their desired report interval mode. In one embodiment, an application may choose between three report interval modes:

Strict mode: in this mode, the sensor stack attempts to send sensor sample readings to each requesting client as close as possible to the requested rate. The receive time rate for sample readings may exhibit jitter due to inconsistencies in how close each sample matches the requested rate. This mode is illustrated in FIG. 3.

Figure 4:
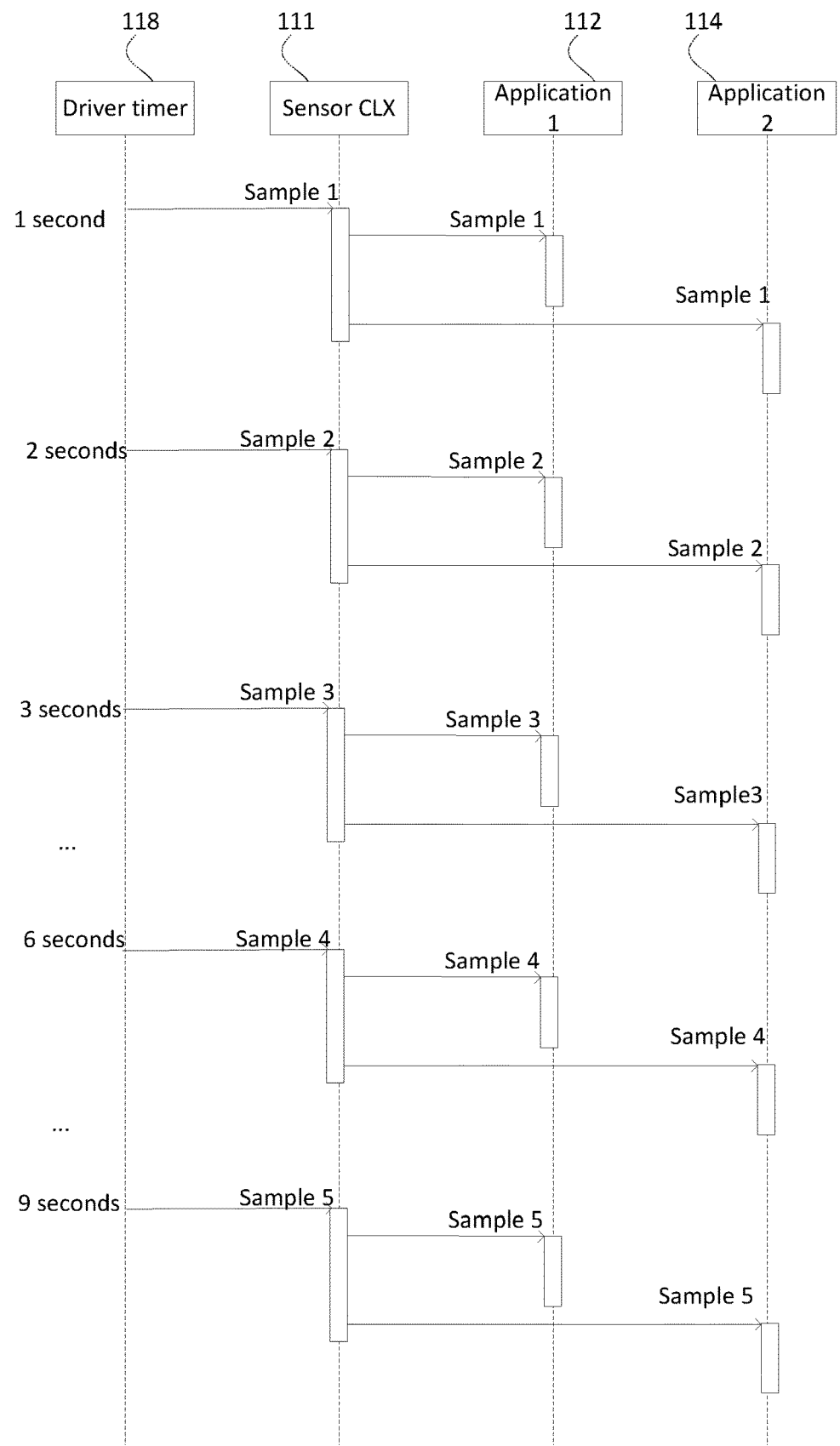
FIG. 4 is a flow chart that illustrates an opportunistic interval mode.

Opportunistic mode: in this mode, the sensor stack may send more samples than what the client has requested. For example, if another client is requesting data at a faster rate (shorter interval), then the sensor stack may send that sensor data at the faster rate to the client requesting data at the slower rate. In this mode, it is guaranteed that the rate at which samples are sent at least match the requested rate. This mode is illustrated in FIG. 4.

Figure 5:
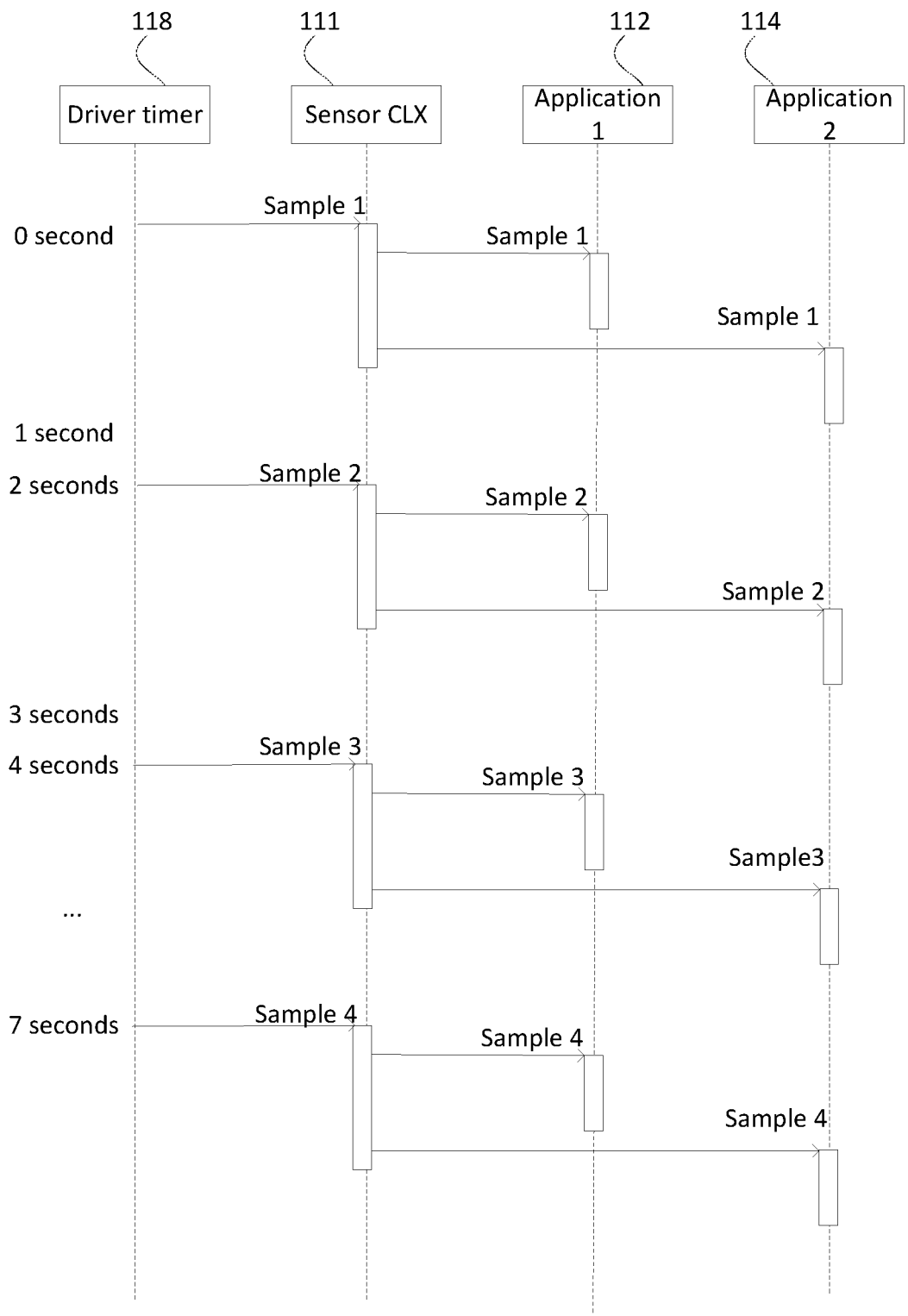
FIG. 5 is a flow chart that illustrates an automatic interval mode.

Automatic mode: in this mode, the sensor stack is responsible for choosing when to best send sample reports. For example, the sensor stack may select the report interval mode for the requesting clients. In some cases, the reporting rate requested by the application may be ignored depending on what the sensor stack selects. This mode is illustrated in FIG. 5.

The reasoning behind adding a selectable report interval mode to the sensor stack is multifold. Power-hungry sensors can leverage external heuristics (such as the result of another, less power-consuming sensor) to intelligently tweak the reporting rate. As a result, the device and its applications can benefit from power savings by allowing drivers to decide the best reporting rate for the applications (i.e., when using the automatic reporting rate).

For example, some sensors may provide more accurate results with a higher reporting rate. Power-friendly applications usually make tradeoffs between battery life and accuracy and often choose a sub-optimal reporting rate from an accuracy perspective for the sake of power savings. Other applications on the system may have hard requirements for faster reporting rates. In this case, the application with the sub-optimal reporting rate may use the other applications' reporting rates opportunistically (i.e., the opportunistic reporting rate).

When multiple clients are accessing the same sensor, the sensor stack may be responsible for arbitrating between settings requested by each application. More specifically, when two clients are requesting different sample report rates, a sensor class extension may be implemented that configures the driver to use the highest report rate. The class extension may then be responsible for filtering packets sent to applications that requested a lower rate, therefore dropping extra packets that were not requested by these applications.

When two clients request different sample rates and the sample rates are incompatible with each other (e.g., a sample rate is a non-multiple of another sample rate—e.g., three second and five second sensor interval requests), the class extension may compromise on rate selection and filtering. Moreover, applications may come and go on the system, and the class extension may respond by reconfiguring the driver and the class extension filtering logic. The strategies described herein for implementing different report interval modes may be utilized to address such issues.

Some sensors may be configured to report sample reading values that were measured since the last sample reading was reported. In some embodiments, the sensor class extension may provide a means to filter samples. In such embodiments, the notion of "last sample reported" may be different from the perspectives of each application and from the driver perspective. Some sensors provide an array of data. Such arrays of data are measured over a period of time and this period of time may be based on the report interval (hence it is report rate dependent). The typical example is the R-R interval arrays for heart rate sensors.

If Application1 112 requests a one second report interval and Application2 114 requests a three second interval, the driver 118 may be configured to send sample reports every one second (driver 118 inherits from the most restrictive interval—i.e., from the application1 112 report interval). However, from the driver perspective, the sample reading only contains the values measured for the last one second. When this array is sent to Application2 114, Application2 114 receives an array filled with values collected since the beginning of the last second, and the array may therefore miss two seconds of data. As caching/stitching of arrays is a typically an expensive operation power-wise, in one embodiment, the stack may instead use the automatic and opportunistic modes to report every sample sent by the driver 118.

When sample readings are sent to a single requesting client, processes for reporting sensor data to the requesting client can be simplified. The sensor driver may be configured to send samples at the client's requested rate, and the sensor class extension may send all of the samples that it collects to the client.

FIG. 3 illustrates an example of a strict interval mode. When an application sets the report interval mode to "strict," the sensor stack 111 tries to match the exact sample report rate requested by the application.

In FIG. 3, Application1 112 requests a 1 second reporting rate and requests the strict report interval mode. At the 3 second mark, Application1 112 then changes the requested reporting rate to 3 seconds. Application2 114 requests a 3 second reporting rate and also requests the strict report interval mode. As a result, both applications Application1 112 and Application2 114 receive exactly what they asked for.

FIG. 4 illustrates an example of an opportunistic interval mode. If an application sets the report interval mode to "opportunistic" and if another application has requested a faster reporting rate, the sensor stack reports the sample readings at the faster reporting rate to both applications. If every other application requested a slower reporting rate than a particular application, all the applications receive samples at the rate of the particular application (disregarding their requested rate).

In FIG. 4, Application1 112 requests a 1 second reporting rate and requests the report interval mode be strict (or opportunistic). Application2 114 requests a 3 second or greater reporting rate and requests the report interval mode be opportunistic. As a result, until the third second, Application2 114 receives samples every second (all the samples originally destined for Application1 112).

At the 3 second mark, application1 112 changes the requested reporting rate to 3 seconds. After this point, both application1 112 and Application2 114 receives samples every 3 seconds.

FIG. 5 illustrates an example of an automatic interval mode. Application1 112 and Application2 114 both set the report interval mode to "automatic" to request that the sensor driver select the most appropriate reporting rate. This mode may be overridden by the sensor stack 111 if one of the client applications requests a mode other than "automatic" (see below).

In FIG. 5, Application1 112 requests the automatic report interval mode. Application2 114 requests the report interval mode be automatic. In one embodiment, the driver 118 may select the most appropriate sample rate. For example, every sample that the driver 118 reports may be sent to both of the applications. The implementation of determine the "most appropriate" sample rate may vary based on the driver and the sensor. One objective for the driver 118 in determining an appropriate sample rate may be to set the report interval so as to save as much power as possible by only reporting relevant data to the requesting application.

In one embodiment, when multiple applications request incompatible modes (e.g., two applications request a strict reporting mode and request sample rates without a common factor), the sensor stack 111 may resolve the conflict based on the following table (each cell below contains the report interval mode and an example of a reporting interval):

| Example number | App1 Requests | App2 Requests | Driver gets | App1 gets | App2 gets |
|---|---|---|---|---|---|
| Example 1 | Strict, 1 s | Strict, 3 s | Strict, 1 s | Strict, 1 s | Strict, 3 s |
| Example 2 | Strict, 1 s | Automatic | Strict, 1 s | Strict, 1 s | Opportunistic, 1 s |
| Example 3 | Strict, 1 s | Opportunistic, 3 s | Strict, 1 s | Strict, 1 s | Opportunistic, 1 s |
| Example 4 | Opportunistic, 1 s | Opportunistic, 3 s | Strict, 1 s | Opportunistic, 1 s | Opportunistic, 1 s |
| Example 5 | Opportunistic, 1 s | Automatic | Strict, 1 s | Opportunistic, 1 s | Opportunistic, 1 s |
| Example 6 | Automatic | Automatic | Automatic (driver default rate) | Automatic (driver default rate) | Automatic (driver default rate) |

The time (in seconds) value in the application request corresponds to the requested interval rate (although, the application may receive data at a shorter interval if it requests the opportunistic mode)

As shown in the table, the driver will either be requested to provide data at the shortest requested interval (this can be considered a type of "strict mode") or in an automatic mode if all of the applications request data in the automatic mode.

In Example 1, when both applications request the strict mode, the data is provided in the strict mode to both applications. In Example 1, App 2 wants sensor data at a longer interval than App1. The sensor stack will attempt to provide data at the longer interval.

In Examples 2 and 5, when one of the applications requests the automatic mode and another application does not, the application(s) that request the automatic mode are provided data in the opportunistic mode.

In Example 3, when one application requests the strict mode and the other application requests the opportunistic mode, the sensor data is sent to the application requesting the opportunistic mode at the shortest requested interval.

In Example 6, all applications request sensor data be sent in an automatic mode and the driver can provide data in the automatic mode.

As shown in the table, the sensor stack 111 may modify a requested interval report mode in certain cases where one application on the system requests a more "strict" reporting mode as compared to another application. When the "automatic" reporting mode is not available, the sensor stack may fall back to "opportunistic" reporting mode.

In one embodiment, when all requesting applications on the system have requested the "automatic" reporting mode, the requested reporting rate by the application may effectively be ignored as the driver may provide its own selected reporting rate.

In cases where the driver 118 does not support the "automatic" mode, the sensor stack may fall back to using the "opportunistic" mode.

In one example use case, heart rate sensor R-R intervals may be provided to the user as a table of values measured since the last sample reading was reported to the sensor stack. When using the "strict" mode, the notion of "last sample reading" may be different from the point of view of the driver/class extension and from the point of view of the application. As mentioned earlier, the sensor class extension may filter out some of the sample readings before sending them to a requesting application. The table of R-R intervals associated with the dropped samples may either be dropped or may require power-consuming stitching to maintain coherency. Some applications may not be interested in R-R intervals and may still want to use the "strict" mode. For these applications, it is desirable to be able to choose between "strict" and "opportunistic" modes.

FIGS. 6 and 7 illustrate example computing systems that may implement described embodiments of FIGS. 1-5. FIG. 6 illustrates an example desktop or laptop. FIG. 7 illustrates an example mobile phone.

FIG. 6 illustrates an example of a computing system 20 that may implement the functionality shown in FIG. 1. The computing system may include sensors (not shown) such as accelerometers, gyroscopes, magnetometer compasses, and barometers. The sensors may interact with software implementing the functionality of FIG. 1 at the processor unit 59.

The computing system 20 is only one example of a suitable computing system and is not intended to suggest any limitation as to the scope of use or functionality of the presently disclosed subject matter. Neither should the computing system 20 be interpreted as having any dependency or requirement relating to any one or combination of components illustrated in the exemplary computing system 20. In some examples, the various computing elements may include circuitry configured to instantiate specific aspects of the present disclosure. For example, the term circuitry used in the disclosure may include specialized hardware components configured to perform function(s) by firmware or switches. In other examples the term circuitry may include a general purpose processing unit, memory, etc., configured by software instructions that embody logic operable to perform function(s). In example examples where circuitry includes a combination of hardware and software, an implementer may write source code embodying logic and the source code may be compiled into machine readable code that may be processed by the general purpose processing unit. Since one skilled in the art may appreciate that the state of the art has evolved to a point where there is little difference between hardware, software, or a combination of hardware/software, the selection of hardware versus software to effectuate specific functions is a design choice left to an implementer. More specifically, one of skill in the art may appreciate that a software process may be transformed into an equivalent hardware structure, and a hardware structure may itself be transformed into an equivalent software process. Thus, the selection of a hardware implementation versus a software implementation is one of design choice and left to the implementer.

Computing system 20 comprises a computer 41, which typically includes a variety of computer readable media. Computer readable media may be any available media that may be accessed by computer 41 and includes both volatile and nonvolatile media, removable and non-removable media. The system memory 22 includes computer storage media in the form of volatile and/or nonvolatile memory such as read only memory (ROM) 23 and random access memory (RAM) 60.

The memory 34, 35, 22 and 47 may comprise a storage medium having a concrete, tangible, physical structure. As is known, a signal does not have a concrete, tangible, physical structure. Memory, as well as any computer-readable storage medium described herein, is not to be construed as a signal. The memory, as well as any computer-readable storage medium described herein, is not to be construed as a transient signal. The memory, as well as any computer-readable storage medium described herein, is not to be construed as a propagating signal. The memory, as well as any computer-readable storage medium described herein, is to be construed as an article of manufacture.

A basic input/output system 24 (BIOS), containing the basic routines that help to transfer information between elements within computer 41, such as during start-up, is typically stored in ROM 23. RAM 60 typically contains data and/or program modules that are immediately accessible to and/or presently being operated on by processing unit 59. By way of example, and not limitation, FIG. 6 illustrates operating system 25, application programs 26, other program modules 27, and program data 28.

The computer 41 may also include other removable/non-removable, volatile/nonvolatile computer storage media. By way of example only, FIG. 6 illustrates a hard disk drive 38 that reads from or writes to non-removable, nonvolatile magnetic media, a magnetic disk drive 39 that reads from or writes to a removable, nonvolatile magnetic disk 54, and an optical disk drive 40 that reads from or writes to a removable, nonvolatile optical disk 53 such as a CD ROM or other optical media. Other removable/non-removable, volatile/nonvolatile computer storage media that may be used in the exemplary operating environment include, but are not limited to, magnetic tape cassettes, flash memory cards, digital versatile disks, digital video tape, solid state RAM, solid state ROM, and the like. The hard disk drive 38 is typically connected to the system bus 21 through an non-removable memory interface such as interface 34, and magnetic disk drive 39 and optical disk drive 40 are typically connected to the system bus 21 by a removable memory interface, such as interface 35.

The drives and their associated computer storage media discussed above and illustrated in FIG. 1, provide storage of computer readable instructions, data structures, program modules and other data for the computer 41. In FIG. 6, for example, hard disk drive 38 is illustrated as storing operating system 58, application programs 57, other program modules 56, and program data 55. Note that these components may either be the same as or different from operating system 25, application programs 26, other program modules 27, and program data 28. Operating system 58, application programs 57, other program modules 56, and program data 55 are given different numbers here to illustrate that, at a minimum, they are different copies. A user may enter commands and information into the computer 41 through input devices such as a keyboard 51 and pointing device 52, commonly referred to as a mouse, trackball or touch pad. Other input devices (not shown) may include a microphone, joystick, game pad, satellite dish, scanner, or the like. These and other input devices are often connected to the processing unit 59 through a user input interface 36 that is coupled to the system bus, but may be connected by other interface and bus structures, such as a parallel port, game port or a universal serial bus (USB). The cameras 226, 228 and capture device 20 may define additional input devices for the computing system 20 that connect via user input interface 36. A monitor 42 or other type of display device is also connected to the system bus 21 via an interface, such as a video interface 32. In addition to the monitor, computers may also include other peripheral output devices such as speakers 44 and printer 43, which may be connected through a output peripheral interface 33. Capture Device 20 may connect to computing system 20 via output peripheral interface 33, network interface 37, or other interface.

The computer 41 may operate in a networked environment using logical connections to one or more remote computers, such as a remote computer 46. The remote computer 46 may be a personal computer, a server, a router, a network PC, a peer device or other common network node, and typically includes many or all of the elements described above relative to the computer 41, although only a memory storage device 47 has been illustrated in FIG. 6. The logical connections depicted include a local area network (LAN) 45 and a wide area network (WAN) 49, but may also include other networks. Such networking environments are commonplace in offices, enterprise-wide computer networks, intranets and the Internet.

When used in a LAN networking environment, the computer 41 is connected to the LAN 45 through a network interface 37. When used in a WAN networking environment, the computer 41 typically includes a modem 50 or other means for establishing communications over the WAN 49, such as the Internet. The modem 50, which may be internal or external, may be connected to the system bus 21 via the user input interface 36, or other appropriate mechanism. In a networked environment, program modules depicted relative to the computer 41, or portions thereof, may be stored in the remote memory storage device. By way of example, and not limitation, FIG. 6 illustrates application programs 48 as residing on memory device 47. It will be appreciated that the network connections shown are exemplary and other means of establishing a communications link between the computers may be used.

FIG. 7 illustrates an example of a phone 70 that may implement the functionality shown in FIG. 1. The phone may include sensors 86 such as accelerometers, gyroscopes, magnetometer compasses, and barometers. The sensors 86 may interact with software implementing the functionality of FIG. 1 at the processor unit 74.

In FIG. 7 is a block diagram of the major parts of possible hardware architecture for mobile phone 70. It should be understood that FIG. 7 is an example and that any mobile phone 70 is not limited to such a hardware architecture.

Mobile phone 70 has a transmitter/receiver circuit 72, which may be a standardized transceiver adapted to operate according to cellular standards, connected to a processor unit 74 and communicatively connecting it to a cellular communication network (not shown). The phone 70 may be adapted for communication via a wireless communication network, e.g., a cellular network, but it may also be adapted for a cordless network. For example, it may be adapted for use in connection with a GSM network, CDMA network, TDMA network, or other kinds of cellular networks and various forms of cordless phone systems or in dual band phones or tri-mode phones accessing sets of these systems/networks. Although not shown in FIG. 7, mobile phone 70 may also have a standard infrared (ir) or Bluetooth wireless port enabling it to directly receive data from another device via a wireless connection.

Speech signals received through transmitter/receiver circuit 72 are Analog-to-Digital (A/D) converted in an A/D converter (not shown), fed to audio processing 76 (such as a codec configured to process signals under the control of processor unit 74) and encoded so as to produce analog signals fed to speaker 78 (and/or an ear-piece) through an amplifier (not shown). Audio processing 76 receives analog signals from microphone 80 after being amplified by an amplifier (not shown) and A/D converted in an A/D converter (not shown). Audio processing 76 also encodes and transfers the encoded signals to processor unit 74 for transmission through transmitter/receiver circuit 72. The audio processing 76 also decodes the signal, which is transferred from the processor unit 74 to the earpiece via a Digital-to-Analog (D/A) converter and amplifier (not shown).

Audio processing 76 is also able to give an output of a ring tone to the buzzer (not shown). The ring tone may be stored in the memory 82 and is recalled when the transmitter/receiver circuit 72 receives an incoming signal, by means of the processor unit 74. Thus, the ring tone is recalled from the memory, forwarded to audio processing 76 and the ring tone is generated as an output from the buzzer (not shown).

Processor unit 74 is connected to, and has an interface associated with memory 82 such as random access memory (RAM) or Flash ROM.

Other memory (including ROM) may also be provided, either separate from, or integrated with, RAM. It is also connected to a power supply, such as a battery. Processor unit 74 also has an interface with a smart card, such as a Subscriber Identity Module (SIM) card (not shown) containing mobile subscriber identity and removably received in a SIM card holder (not shown), a display/input 84 such as a touchscreen.

There may be additional an input/output (I/O) units (not shown) configured for any or all of the parts connected to processor unit 74. During operation, the processor unit 74 monitors the activity in the phone and controls the display 84 in response thereto. Therefore, it is the processor unit 74 which detects the occurrence of a state change event and changes the state of the phone and thus the display text. A state change event may be caused by the user activating the keypad or touching the display/input 84, and these types of events are called entry events or user events. However, the network communicating with the phone may also cause a state change event. This type of event and other events beyond the user's control are called non-user events. Non-user events comprise status change during call set-up, change in battery voltage, change in antenna conditions, message on reception of Short Messaging Service (SMS) messages, etc.

Alternatively, or in addition, the functionally described herein may be performed, at least in part, by one or more hardware logic components. For example, and without limitation, illustrative types of hardware logic components that may be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Computer-readable storage media may provide storage for instructions for the one or more processors. Although the description of computer-readable storage media contained herein refers to a mass storage device, such as a hard disk or CD-ROM drive, it should be appreciated by those skilled in the art that computer-readable media may be any available storage media.

By way of example, and not limitation, computer-readable storage media may include volatile and non-volatile, removable and non-removable media implemented in any method or technology for storage of information such as computer-readable instructions, data structures, program modules or other data. For example, computer-readable media includes, but is not limited to, RAM, ROM, EPROM (erasable programmable read only memory), EEPROM (electrically erasable programmable read only memory), Flash memory or other solid state memory technology, CD-ROM, DVDs, HD-DVD (High Definition DVD), BLU-RAY, or other optical storage, magnetic cassettes, magnetic tape, magnetic disk storage or other magnetic storage devices, or any other medium which may be used to store the desired information and instructions. For purposes of this specification and the claims, the phrase "computer-readable storage medium" and variations thereof, does not include waves, signals, and/or other transitory and/or intangible communication media.

It should be appreciated that any software components described herein may, when loaded into a processor and executed, transform the processor from a general-purpose computing system into a special-purpose computing system customized to facilitate the functionality presented herein. The processor may be constructed from any number of transistors or other discrete circuit elements, which may individually or collectively assume any number of states. More specifically, the processor may operate as a finite-state machine, in response to executable instructions contained within the software modules disclosed herein. These processor-executable instructions may transform the processor by specifying how the processor transitions between states, thereby transforming the transistors or other discrete hardware elements constituting the processor.

Encoding the software modules presented herein also may transform the physical structure of the computer-readable storage media presented herein. The specific transformation of physical structure may depend on various factors, in different implementations of this description. Examples of such factors may include, but are not limited to, the technology used to implement the computer-readable storage media, whether the computer-readable storage media is characterized as primary or secondary storage, and the like. For example, if the computer-readable storage media is implemented as semiconductor-based memory, the software disclosed herein may be encoded on the computer-readable storage media by transforming the physical state of the semiconductor memory. For example, the software may transform the state of transistors, capacitors, or other discrete circuit elements constituting the semiconductor memory. The software also may transform the physical state of such components in order to store data thereupon.

As another example, the computer-readable storage media disclosed herein may be implemented using magnetic or optical technology. In such implementations, the software presented herein may transform the physical state of magnetic or optical media, when the software is encoded therein. These transformations may include altering the magnetic characteristics of particular locations within given magnetic media. These transformations also may include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the architecture in order to store and execute the software components presented herein. It also should be appreciated that the architecture may include other types of computing devices, including hand-held computers, embedded computer systems, smartphones, PDAs, and other types of computing devices known to those skilled in the art. It is also contemplated that the architecture may not include all of the components shown in the figures, may include other components that are not explicitly shown in the figures, or may utilize an architecture completely different from that shown the figures.

Although the subject matter presented herein has been described in language specific to computer structural features, methodological and transformative acts, specific computing machinery, and computer-readable storage media, it is to be understood that the methods and devices defined in the appended claims is not necessarily limited to the specific features, acts, or media described herein. Rather, the specific features, acts, and mediums are disclosed as example forms of implementing the claims.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. It is intended that the scope of the technology be defined by the claims appended hereto.

What is claimed:

1. A method for use by a computing device comprising at least one processor, at least one memory, and an associated sensor, wherein computer-executable instructions are stored in the at least one memory which, when executed by the at least one processor, cause the computing device to perform operations comprising:
receiving, from multiple applications, requests for sensor data from the associated sensor, the requests including sensor sample intervals and wherein at least some of the sensor sample intervals are different;

receiving, from the multiple applications, requests for report interval modes for the sensor data to be provided by the associated sensor to the multiple applications, wherein the requested report interval modes indicate how to send the sensor data when the sensor sample intervals from the multiple applications are different; and sending the sensor data to the multiple applications based on the requested report interval modes and the sensor sample intervals;

wherein the requested report interval modes comprise an opportunistic mode where the sensor data is allowed to be sent to a respective application of the multiple applications at a rate higher than a requested sensor sample interval from the respective application.

2. The method of claim 1, wherein the receiving steps are performed at a sensor stack.

3. The method of claim 1, wherein the report interval modes include a strict mode in which the computing device attempts to provide data at the requested sensor sample intervals.

4. The method of claim 1, wherein the report interval modes include an automatic mode in which the computing device provides data at a rate determined by a driver for the associated sensor.

5. The method of claim 1, further comprising receiving data from a driver associated with the associated sensor.

6. The method of claim 1, further comprising providing data to the multiple applications according to the report interval mode.

7. A system comprising:

a sensor;

one or more storage devices; and one or more processors in communication with the one or more storage devices, wherein the one or more processors are configured to:

receive requests from multiple applications for sensor data from the sensor, the requests indicating sensor sample intervals and report interval modes; wherein at least some of the requested sensor sample intervals are different;

select a report interval mode out of the requested report interval modes, wherein the report interval modes indicate how to send the sensor data when the sensor sample intervals are different; and send the sensor data to the multiple applications based on the selected report interval mode and the requested sensor sample intervals;

wherein the requested report interval modes comprise an opportunistic mode where the sensor data is allowed to be sent to a respective application of the multiple applications at a rate higher than a requested sensor sample interval from the respective application.

8. The system of claim 7, wherein the system implements a sensor stack to receive the requests and select the report interval mode.

9. The system of claim 7, wherein the report interval modes include a strict mode in which the system attempts to provide data at the requested sample intervals.

10. The system of claim 7, wherein the report interval modes include an automatic mode in which the system provides data at a rate determined by a driver for the sensor.

11. The system of claim 7, wherein the system is a smartphone.

12. The system of claim 7, wherein the system is a desktop computer.

13. The system of claim 7, wherein the system is a laptop computer.

14. A computer-readable storage medium comprising executable instructions that when executed by a processor of a computing device, cause the computing device to effectuate operations comprising:

receiving multiple requests from multiple applications for sensor data from a sensor, the multiple requests indicating requested sensor sample intervals and wherein at least some of the requested sample intervals are different;

selecting a report interval mode out of multiple report interval modes for the data to be provided to the multiple applications by the sensor, wherein the report interval modes are requested by the multiple applications and indicate how to send the sensor data when the requested sensor sample intervals are different; and sending the sensor data to the multiple applications based on the selected report interval mode and the requested sensor sample intervals;

wherein the requested report interval modes comprise an opportunistic mode where the sensor data is allowed to be sent to a respective application of the multiple applications at a rate higher than a requested sensor sample interval from the respective application.

15. The computer-readable storage medium of claim 14, wherein the receiving and selecting steps are performed at a sensor stack.

16. The computer-readable storage medium of claim 14, wherein the multiple report interval modes include a strict mode in which the computing device attempts to provide data at the requested sensor sample intervals.

17. The computer-readable storage medium of claim 14, wherein the multiple report interval modes include an automatic mode in which the computing device provides data at a rate determined by a driver for the sensor.

* * * * *